United States Patent
Liu et al.

(10) Patent No.: US 11,430,956 B2
(45) Date of Patent: Aug. 30, 2022

(54) RRAM CELL STRUCTURE WITH CONDUCTIVE ETCH-STOP LAYER

(71) Applicant: Taiwan Semiconductor Manufacturing Co., Ltd., Hsin-Chu (TW)

(72) Inventors: Ming Chyi Liu, Hsinchu (TW); Yuan-Tai Tseng, Zhubei (TW); Chern-Yow Hsu, Chu-Bei (TW); Shih-Chang Liu, Alian Township (TW); Chia-Shiung Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 27 days.

(21) Appl. No.: 16/578,304

(22) Filed: Sep. 21, 2019

(65) Prior Publication Data

US 2020/0020856 A1    Jan. 16, 2020

Related U.S. Application Data

(62) Division of application No. 16/009,327, filed on Jun. 15, 2018, now Pat. No. 11,158,797, which is a
(Continued)

(51) Int. Cl.
*H01L 45/00* (2006.01)
*H01L 27/24* (2006.01)

(52) U.S. Cl.
CPC ...... *H01L 45/1691* (2013.01); *H01L 27/2436* (2013.01); *H01L 45/04* (2013.01);
(Continued)

(58) Field of Classification Search
CPC .................................................. H01L 45/1691
See application file for complete search history.

(56) References Cited

U.S. PATENT DOCUMENTS 6,004,188 A   12/1999 Roy
6,849,891 B1   2/2005 Hsu et al.
(Continued)

FOREIGN PATENT DOCUMENTS

WO    2009126891 A1    10/2009

OTHER PUBLICATIONS

Wong, et al. "Metal-Oxide RRAM." Proceedings of the IEEE, vol. 100, No. 6, Jun. 2012. 20 Pages.
(Continued)

*Primary Examiner* — Abul Kalam
(74) *Attorney, Agent, or Firm* — Eschweiler & Potashnik, LLC (57) ABSTRACT

The present disclosure relates to a resistive random access memory (RRAM) device architecture, that includes a thin single layer of a conductive etch-stop layer between a lower metal interconnect and a bottom electrode of an RRAM cell. The conductive etch-stop layer provides simplicity in structure and the etch-selectivity of this layer provides protection to the underlying layers. The conductive etch stop layer can be etched using a dry or wet etch to land on the lower metal interconnect. In instances where the lower metal interconnect is copper, etching the conductive etch stop layer to expose the copper does not produce as much non-volatile copper etching by-products as in traditional methods. Compared to traditional methods, some embodiments of the disclosed techniques reduce the number of mask step and also reduce chemical mechanical polishing during the formation of the bottom electrode.

20 Claims, 8 Drawing Sheets

Related U.S. Application Data division of application No. 14/196,361, filed on Mar. 4, 2014, now Pat. No. 10,003,022.

(52) U.S. Cl.
CPC ........ *H01L 45/122* (2013.01); *H01L 45/1233* (2013.01); *H01L 45/1253* (2013.01); *H01L 45/145* (2013.01); *H01L 45/146* (2013.01); *H01L 45/1675* (2013.01)

(56) References Cited

U.S. PATENT DOCUMENTS

| | | | |
|---|---|---|---|
| 7,029,925 | B2 | 4/2006 | Celii et al. |
| 7,169,637 | B2 | 1/2007 | Zhang et al. |
| 7,388,771 | B2 | 6/2008 | Ho et al. |
| 7,407,858 | B2 | 8/2008 | Li et al. |
| 7,795,606 | B2 | 9/2010 | Jin et al. |
| 7,960,813 | B2 | 6/2011 | Liu |
| 8,000,128 | B2 | 8/2011 | Li et al. |
| 8,009,454 | B2 | 8/2011 | Lee et al. |
| 8,213,216 | B2 | 7/2012 | Wang et al. |
| 8,450,714 | B2 | 5/2013 | Yasutake |
| 8,618,585 | B2 | 12/2013 | Sato |
| 8,642,985 | B2 | 2/2014 | Chen et al. |
| 8,956,881 | B2 | 2/2015 | Kikuchi et al. |
| 8,963,114 | B2 | 2/2015 | Liao et al. |
| 9,040,952 | B2 | 5/2015 | Ha |
| 2001/0023119 | A1 | 9/2001 | Reinberg |
| 2003/0176073 | A1 | 9/2003 | Ying et al. |
| 2004/0042261 | A1 | 3/2004 | Tuttle |
| 2005/0054122 | A1* | 3/2005 | Celii .............. H01L 21/32139 438/3 |
| 2005/0079727 | A1 | 4/2005 | Zhang et al. |
| 2005/0124112 | A1 | 6/2005 | Hsu et al. |
| 2005/0243630 | A1 | 11/2005 | Hsu et al. |
| 2007/0117315 | A1 | 5/2007 | Lai et al. |
| 2008/0315174 | A1 | 12/2008 | Kang et al. |
| 2009/0073741 | A1 | 3/2009 | Liu |
| 2010/0007344 | A1 | 1/2010 | Guo et al. |
| 2010/0224921 | A1 | 9/2010 | Wang |
| 2011/0007552 | A1 | 1/2011 | Ahn et al. |
| 2011/0021000 | A1 | 1/2011 | Kodaira et al. |
| 2011/0147694 | A1 | 6/2011 | Song et al. |
| 2011/0272600 | A1 | 11/2011 | Bert et al. |
| 2012/0032238 | A1 | 2/2012 | Teo et al. |
| 2012/0064682 | A1 | 3/2012 | Jang et al. |
| 2012/0147649 | A1 | 6/2012 | Samachisa et al. |
| 2012/0175580 | A1 | 7/2012 | Song et al. |
| 2012/0214262 | A1 | 8/2012 | Yu et al. |
| 2012/0261636 | A1 | 10/2012 | Zhou et al. |
| 2012/0286231 | A1 | 11/2012 | Saito et al. |
| 2012/0294065 | A1 | 11/2012 | Hong et al. |
| 2013/0095633 | A1 | 4/2013 | Kakegawa et al. |
| 2013/0112935 | A1 | 5/2013 | Himeno et al. |
| 2013/0114325 | A1 | 5/2013 | Lin et al. |
| 2014/0145135 | A1 | 5/2014 | Gee et al. |
| 2014/0175359 | A1 | 6/2014 | Wang et al. |
| 2015/0016174 | A1 | 1/2015 | Lin et al. |
| 2015/0029779 | A1 | 1/2015 | Lee et al. |

OTHER PUBLICATIONS

U.S. Appl. No. 14/196,416, filed Mar. 4, 2014. 26 Pages.
Non Final Office Action dated Aug. 10, 2015 U.S. Appl. No. 14/196,416.
Final Office Action dated Dec. 18, 2015 U.S. Appl. No. 14/196,416.
Notice of Allowance dated Mar. 9, 2016 U.S. Appl. No. 14/196,416.
Non Final Office Action dated Sep. 9, 2016 for U.S. Appl. No. 14/196,361.
Final Office Action dated Mar. 24, 2017 for U.S. Appl. No. 14/196,361.
Non Final Office Action dated Sep. 11, 2017 for U.S. Appl. No. 14/196,361.
Notice of Allowance dated Feb. 13, 2018 for U.S. Appl. No. 14/196,361.
Non Final Office Action dated Jul. 31, 2019 for U.S. Appl. No. 16/009,327.

* cited by examiner

RRAM CELL STRUCTURE WITH CONDUCTIVE ETCH-STOP LAYER

REFERENCE TO RELATED APPLICATION

This Application is a Divisional of U.S. application Ser. No. 16/009,327, filed on Jun. 15, 2018, which is a Divisional of U.S. application Ser. No. 14/196,361, filed on Mar. 4, 2014 (now U.S. Pat. No. 10,003,022, issued on Jun. 19, 2018). The contents of the above-referenced Patent Applications are hereby incorporated by reference in their entirety.

BACKGROUND

Non-volatile memories are used in a wide variety of commercial and military electronic devices and equipment. Resistive random access memory (RRAM) is one promising candidate for next generation non-volatile memory technology due to its simple structure and CMOS logic compatible process technology that is involved. Each RRAM cell includes a metal oxide material sandwiched between top and bottom electrodes. This metal oxide material has a variable resistance whose resistance level corresponds to a data state stored in the RRAM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An RRAM cell includes two electrodes with a resistive switching element placed between the two electrodes. Resistive switching elements or a variable resistive dielectric layer use a "forming process" to prepare a memory device for use. The forming process is typically applied at the factory, at assembly, or at initial system configuration. A resistive switching material is normally insulating, but a sufficient voltage (known as a forming voltage) applied to the resistive switching material will form one or more conductive pathways in the resistive switching material. Through the appropriate application of various voltages (e.g. a set voltage and reset voltage), the conductive pathways may be modified to form a high resistance state or a low resistance state. For example, a resistive switching material may change from a first resistivity to a second resistivity upon the application of a set voltage, and from the second resistivity back to the first resistivity upon the application of a reset voltage.

An RRAM cell may be regarded as storing a logical bit, where the resistive switching element has increased resistance, the RRAM cell may be regarded as storing a "0" bit; where the resistive switching element has reduced resistance, the RRAM cell may be regarded as storing a "1" bit, and vice-versa. Circuitry may be used to read the resistive state of the resistive switching element by applying a read voltage to the two electrodes and measuring the corresponding current through the resistive switching element. If the current through the resistive switching element is greater than some predetermined baseline current, the resistive switching element is deemed to be in a reduced resistance state, and therefore the RRAM cell is storing a logical "1." On the other hand, if the current through the resistive switching element is less than some predetermined baseline current, then the resistive switching element is deemed to be in an increased resistance state, and therefore the RRAM cell is storing a logical "0."

RRAM cells have conductive interconnects that connect the top and bottom electrodes to the rest of the device. In traditional RRAM cells, mask patterning and etching steps are involved while forming a bottom electrode via (BEVA) and a top electrode. Since the BEVA formed over a dielectric capping layer (with an opening) creates an uneven topography, a chemical mechanical polishing (CMP) process is carried out on the bottom electrode, so as to reduce topographic issues. Moreover, an etching process, which is carried out on the dielectric capping layer to form a bottom electrode via, would land on the lower metal interconnect (which is normally copper) and could lead to non-volatile copper etching by-products which in turn makes a cell chamber contaminated and difficult to maintain.

Accordingly, the present disclosure relates to a new architecture for RRAM cells that includes a conductive etch-stop layer between a lower metal connect and a bottom electrode of an RRAM stack. This architecture has a substantially planar topography and hence no CMP process is required during or after the formation of the bottom electrode. The conductive etch-stop layer provides simplicity in structure and the etch-selectivity of this layer provides protection to the extremely low-k dielectric layer under the RRAM stack during the formation of the RRAM cell. The conductive etch stop layer can be etched using a dry or wet to land on copper which does not produce as much non-volatile copper etching by-products as in traditional methods. Moreover, this structure does not involve mask patterning steps for the formation of the bottom electrode or conductive etch-stop layer.

Figure 1:
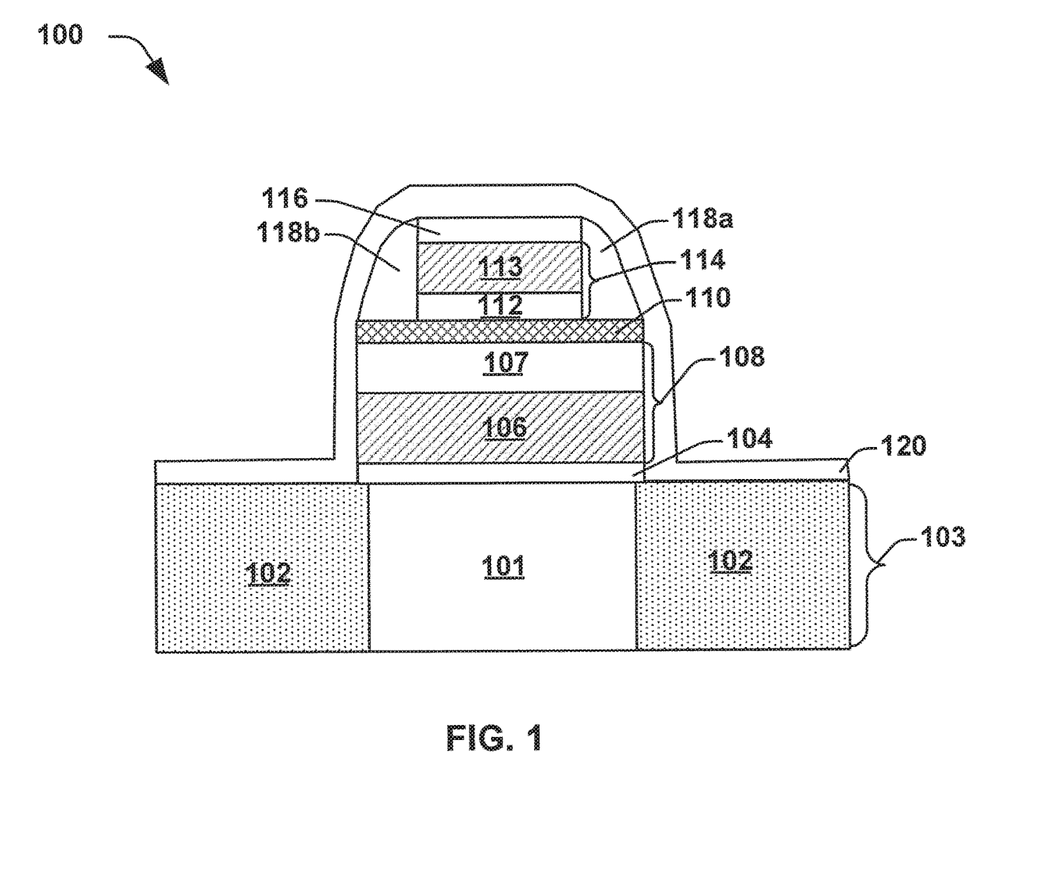
FIG. 1 illustrates a cross sectional view of an RRAM stack according to some embodiments of the present disclosure.

FIG. 1 illustrates a cross sectional view of an RRAM stack 100 according to some embodiments of the present disclosure. The RRAM stack 100 resides over a semiconductor work-piece 103 comprising a conductive metal region 101 which has extremely low-k dielectric region 102 on either side. A conductive etch-stop layer 104 is disposed directly above the conductive metal region 101. Above the conductive etch-stop layer 104 resides a bottom electrode 108. In some embodiments the bottom electrode 108 comprises a transitional nitride layer 106 and a conductive electrode layer 107 above the transitional nitride layer 106. A variable resistive dielectric layer or resistive switching element 110 abuts the entire top surface of the bottom electrode 108. The variable resistive dielectric layer 110 and the bottom electrode 108 have vertical side walls that are aligned to one another. A top electrode 114 resides above the variable resistive dielectric layer 110 at a defined region. In one embodiment the top electrode 114 comprises a conductive electrode layer 112 and a transitional nitride layer 113 that resides on top of conductive electrode layer 112. Two spacers 118a and 118b are disposed on either side of the top electrode 114. The spacers 118a and 118b also reside on the two end locations of the variable resistive dielectric layer 110. An antireflective layer 116 is disposed above the top electrode 114. The antireflective layer 116 and the top electrode 114 have vertical sidewalls that are aligned to one another. A dielectric protection layer 120 envelopes the whole RRAM stack and resides above the semiconductor work-piece 103.

As will be appreciated in greater detail below, the conductive etch stop layer 104 has an etch-selectivity that is different from that of the transitional nitride layer 106. During manufacturing, this different etch-selectivity allows the conductive etch stop layer 104 to remain in place while the transitional nitride layer 106 is etched away. Thus, the transitional nitride layer 106 can be removed with a first etch which stops on the conductive etch stop layer 104, such that the conductive etch stop layer 104 protects the underlying metal region 101 and low-k dielectric region 102 from the first etch process. A second etch can then be used to remove the conductive etch stop layer 104, whereby the etched conductive electrode 107 and etched transitional nitride layer 106 act as a mask of sorts for the second etch, such that the final conductive etch stop layer 104 has sidewalls that are self-aligned with sidewalls of the transitional nitride layer 106. Because the second etch can end on low-k dielectric 102, the second etch can be tailored to limit damage to an upper surface of low-k dielectric 102, which can have a relatively low structural integrity to due to its porous nature in some embodiments. Further, because this second etch can end on metal region 101, which can be copper, the second etch can be tailored to limit non-volatile copper etching by-products in some instances. Thus, the use of materials with different etch selectivities for conductive etch stop layer 104 and transitional nitride layer 106 is advantageous from a variety of perspectives. Moreover, these etching techniques for RRAM stack 100 can limit the required mask patterning steps compared to conventional approaches.

Figure 2:
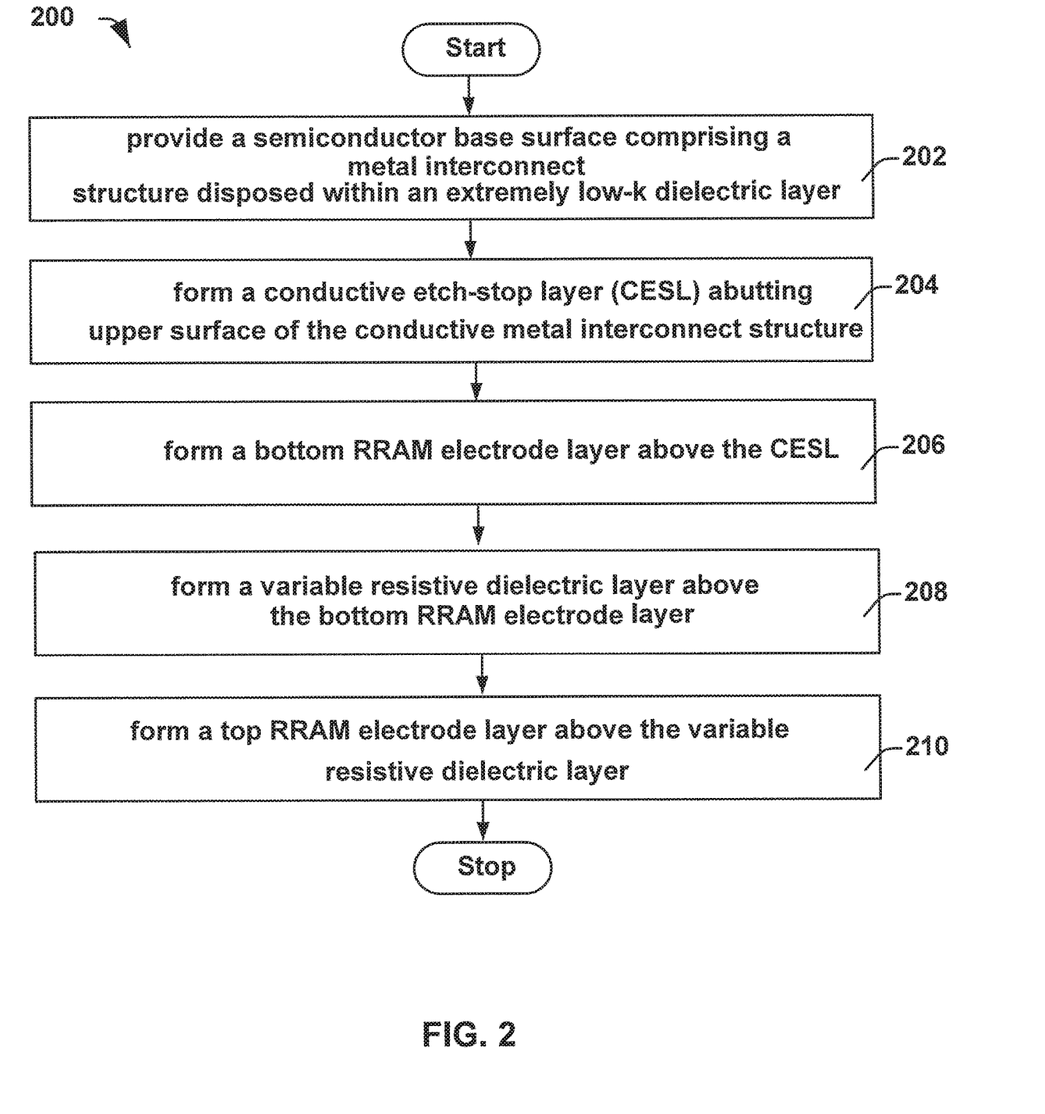
FIG. 2 illustrates a flow diagram of some embodiments of a method for forming an RRAM stack with a conductive etch stop layer according to the present disclosure.

FIG. 2 illustrates a flow diagram of some embodiments of a method 200 for forming an RRAM device with a conductive etch stop layer according to the present disclosure. While disclosed method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a semiconductor base surface comprising a metal interconnect structure disposed within an extremely low-k dielectric layer is provided. In some embodiments, the metal interconnect structure comprises copper.

At 204, conductive etch-stop layer (CESL) is formed, abutting an upper surface of the metal interconnect structure. In some embodiments, the conductive etch stop layer comprises titanium (Ti); titanium nitride (TiN); titanium tungsten metal (TiW); tungsten (W); tungsten nitride (WN); a combination of titanium, cobalt or tantalum (Ti/Co/Ta); or tantalum nitride (TaN).

At 206, a bottom RRAM electrode layer is formed above the CESL. In some embodiments, the bottom RRAM electrode comprises a conductive electrode layer over a transitional nitride layer. In some embodiments, the bottom RRAM electrode layer comprises only a conductive electrode layer. The transitional nitride layer provides bipolar switching and comprises of TiN or TaN in some embodiments. In some other embodiments, the conductive electrode layer of the bottom RRAM electrode comprises TiN.

At 208, a variable resistive dielectric layer is formed above the bottom RRAM electrode layer. In some embodiments, the variable resistive dielectric layer comprises hafnium oxide (HfO2).

At 210, a top RRAM electrode layer is formed above the variable resistive dielectric layer. In some embodiments, the top RRAM electrode comprises a conductive electrode layer with a transitional nitride layer above the conductive electrode layer. In some embodiments, the conductive electrode layer of the top RRAM electrode comprises Ti and the transitional nitride layer comprises TaN.

Figure 3:
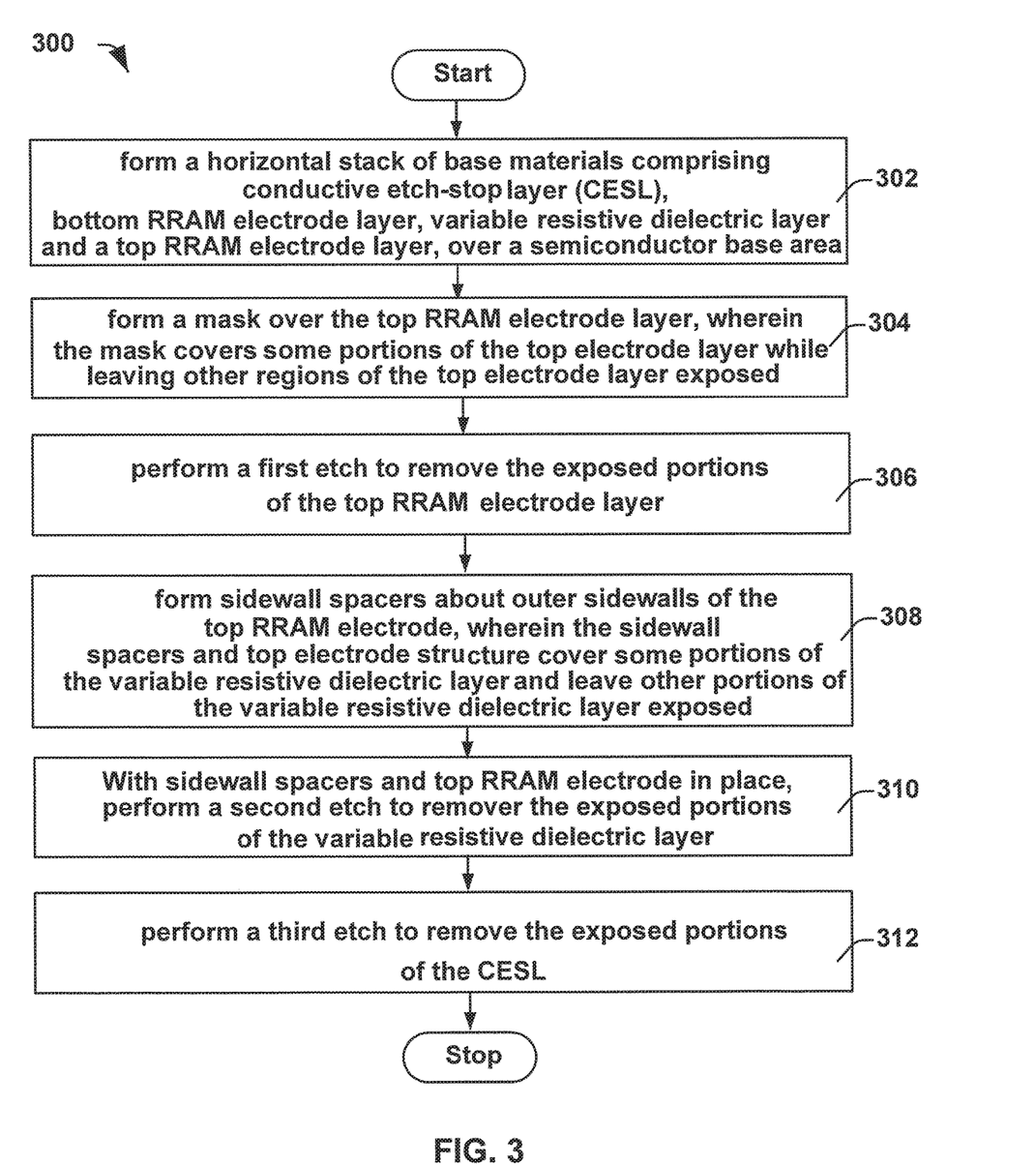
FIG. 3 illustrates a flow diagram of some embodiments of a step by step method for forming an RRAM stack with a conductive etch stop layer according to the present disclosure.

FIG. 3 illustrates a flow diagram of some embodiments of a method 300 for forming an RRAM stack with a conductive etch stop layer according to the present disclosure. While disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a horizontal stack of base materials for the RRAM stack are formed over a semiconductor work-piece, the base materials comprising a conductive etch-stop layer (CESL), a bottom electrode, a variable resistive dielectric layer, and a top electrode.

At 304, a mask is formed over the top electrode layer. The mask covers some portions of the top electrode layer while leaving other regions of the top electrode layer exposed. In some embodiments, the top electrode comprises a conductive electrode layer and a transitional metal nitride over the conductive electrode layer.

At 306, a first etch is performed to remove exposed of the top electrode layer and form a top electrode structure. In some embodiments, the first etch comprises a dry etch comprising chlorine based (Cl2/BCl2) or fluorine based (CF4/CHF3/CH2/SF6) etchants.

At 308, sidewall spacers are formed about the outer sidewalls of the top electrode. The sidewall spacers and top electrode structure cover some portions of the variable resistive dielectric layer and leave other portions of the variable resistive dielectric layer exposed. In some embodiments, the top electrode comprises TaN over Ti, and the sidewall spacer material comprises SiN (silicon nitride).

At 310, a second etch is performed to remove exposed portions of the variable resistive dielectric layer. With the sidewall spacers and top electrode structure in place, performing a second etch removes the exposed portions of the variable resistive dielectric layer as well as underlying portions of the bottom electrode to form a bottom electrode structure. The second etch stops at the CESL such that the bottom electrode structure covers some portions of the CESL while leaving other portions of the CESL exposed. In some embodiments, the bottom electrode comprises a conductive electrode layer (e.g. TiN) over a transitional nitride layer (e.g. TaN) or a single layer of any conductive electrode layer. In some embodiments, the second etch comprises a dry etch comprising chlorine based (Cl2/BCl2) or fluorine based (CF4/CHF3/CH2/SF6) etchants.

At 312, a third etch is performed to remove exposed portions of the CESL. In some embodiments, the third etch comprises wet etching comprising an alkali base (hydrogen peroxide (H2O2) or ammonia-peroxide mixture (APM)) or acid base (hydrogen fluoride (HF) or hydrochloric acid (HCl)) etchants or dry etching comprising chlorine based (Cl2/BCl2) or fluorine based (CF4/CHF3/CH2/SF6) etchants.

FIGS. 4-9 illustrate embodiments of cross sectional images of a method of formation of an RRAM stack with a conductive etch stop layer according to the present disclosure.

Figure 4:
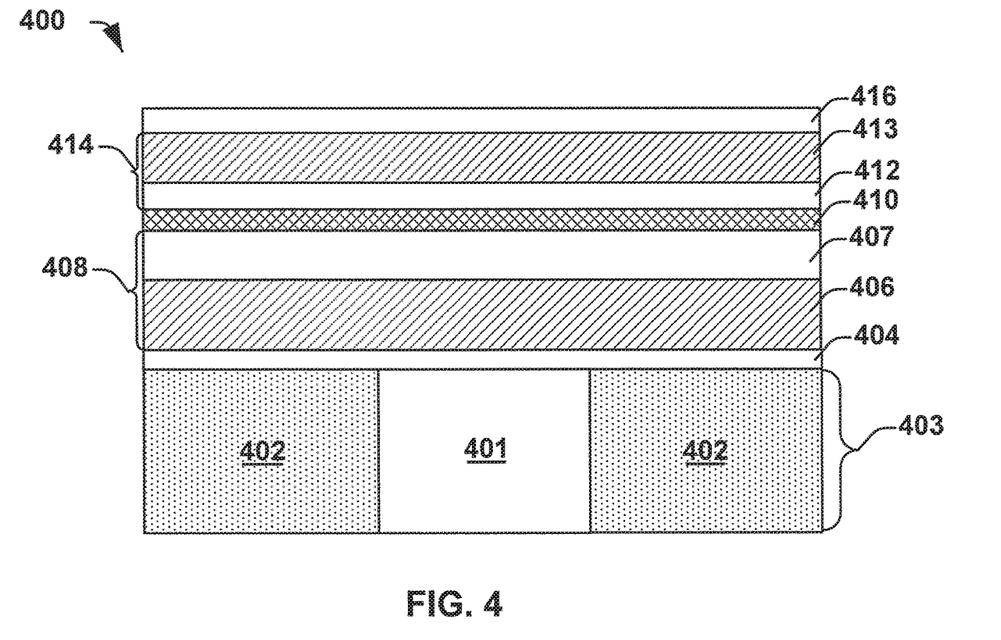
FIGS. 4-9 illustrate embodiments of cross sectional images of a step by step method of formation of an RRAM stack with a conductive etch stop layer according to the present disclosure.

FIG. 4 illustrates a cross sectional image 400 of a semiconductor body having a horizontal stack of base materials over a semiconductor work-piece, for forming the RRAM stack. The semiconductor work-piece 403 comprises a metal interconnect structure 401 disposed within extremely low-k dielectric regions 402. In some embodiments, the metal interconnect structure 401 comprises copper (Cu) and the extremely low-k dielectric regions 402 comprises porous silicon dioxide, fluorinated silica glass, polyimides, polynorbornenes, benzocyclobutene, or PTFE. Over the semiconductor work-piece 403, a conductive etch-stop layer 404 is disposed. The conductive etch-stop layer 404 has an etch-selectivity that is different from that of the underlying semiconductor work-piece 403 as well as the layer above the conductive etch-stop layer 404. The conductive etch-stop layer 404 can comprise Ti, TiN, TiW, W, WN, Ti/Co/Ta or TaN and its thickness ranges from 10 Angstroms to 150 Angstroms. Above the conductive etch-stop layer 404, a bottom electrode 408 is deposited. The bottom electrode 408 comprises a transitional nitride layer 406 and a conductive bottom electrode layer 407. In some embodiments, the transitional nitride layer 406 comprises TaN with a thickness of approximately 200 Angstroms and the conductive bottom electrode layer 407 comprises TiN with a thickness of approximately 100 Angstroms. Above the bottom electrode 408, a variable resistive dielectric layer 410 is deposited. In some embodiments, the variable resistive dielectric layer 410 comprises HfO2 with a thickness of approximately 50 Angstroms. Over the variable resistive dielectric layer 410 resides a top electrode 414. In some embodiments, the top electrode 414 comprises a conductive top electrode layer 412 and a transitional nitride layer 413. In some embodiments, the conductive top electrode layer 412 comprises Ti, platinum (Pt) or ruthenium (Ru) with a thickness of approximately 50 Angstroms and the transitional nitride layer 413 comprises TaN with a thickness of approximately 250 Angstroms. Abutting the top surface of the top electrode 414, an insulating anti-reflective layer 416 is deposited. This layer protects the underlying layers from the future etching steps and operated to improve patterning by reducing light reflection that causes standing waves. In some embodiment, the anti-reflective layer comprises SiON with a thickness of approximately 400 Angstroms.

Figure 5:
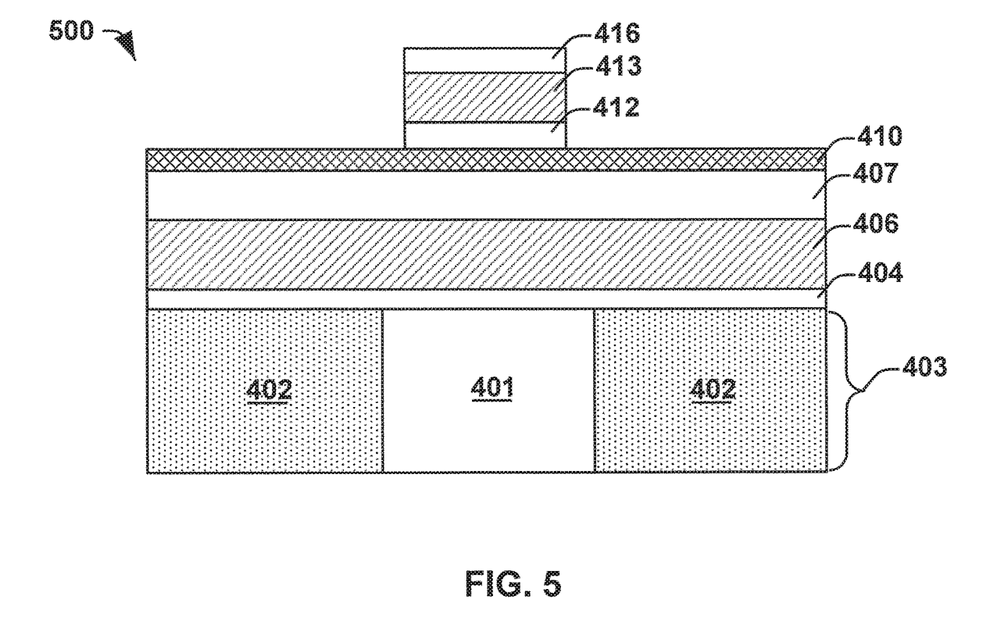

FIG. 5 illustrates a cross sectional image 500, after performing a first etch on the horizontal stack in image 400. After the first etch, a top electrode structure comprising the top electrode 408 and the antireflective layer 416 is formed at the center of the variable resistive dielectric layer 410 leaving exposed portions of the variable resistive dielectric layer 410 on either side.

Figure 6:
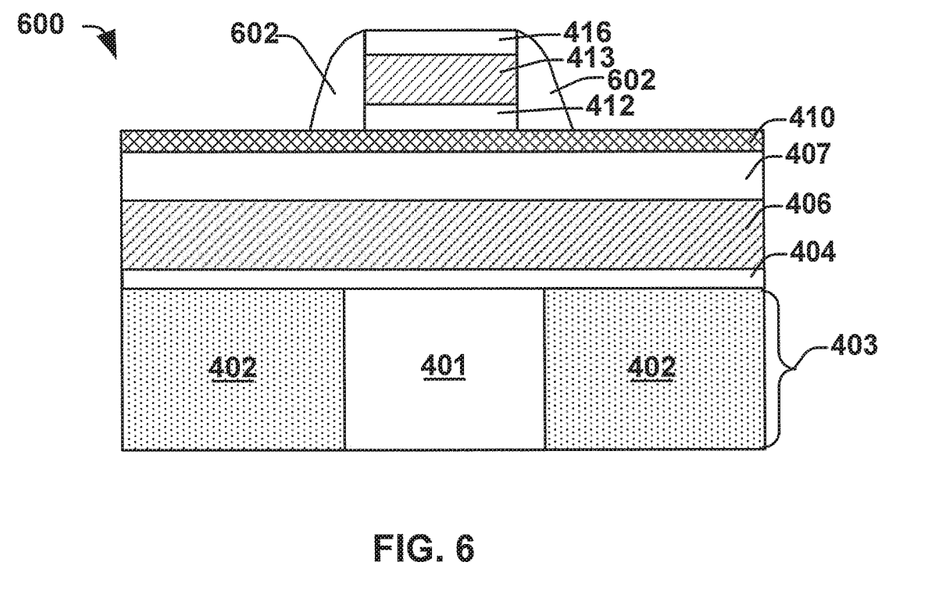

FIG. 6 illustrates a cross sectional image 600, after forming spacers 602 on either side of the top electrode structure. In some embodiments, the spacer material comprises silicon nitride (SiN).

Figure 7:
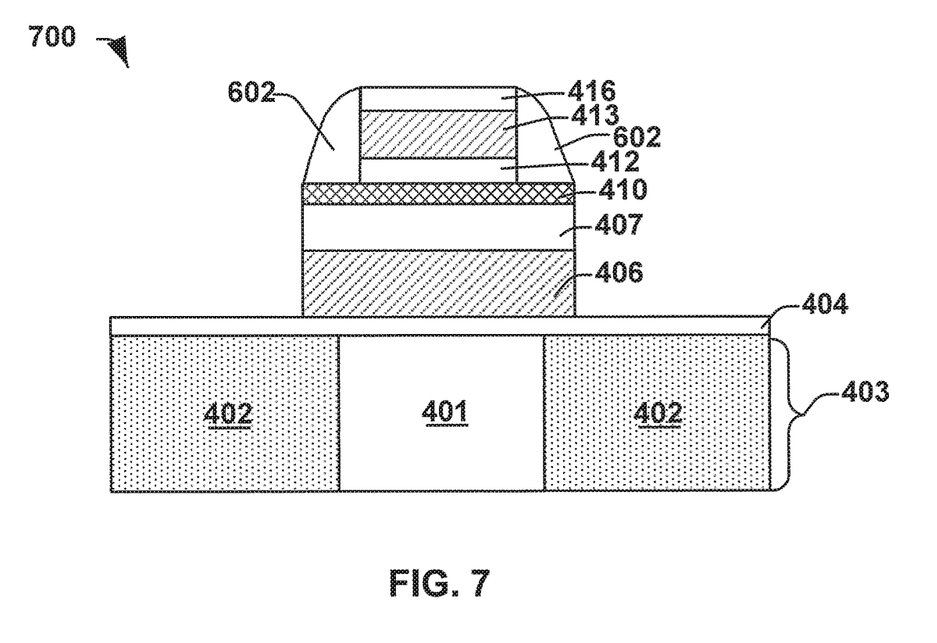

FIG. 7 illustrates a cross sectional image 700, after performing a second etch on the semiconductor body in FIG. 6. With the sidewall spacers 602 and top electrode structure in place, performing a second etch would remove the exposed portions of the variable resistive dielectric layer 410 as well as underlying portions of the bottom electrode 408 to form a bottom electrode structure. The second etch stops at the CESL 404 such that the bottom electrode structure covers some portions of the CESL 404 while leaving other portions of the CESL 404 exposed.

Figure 8:
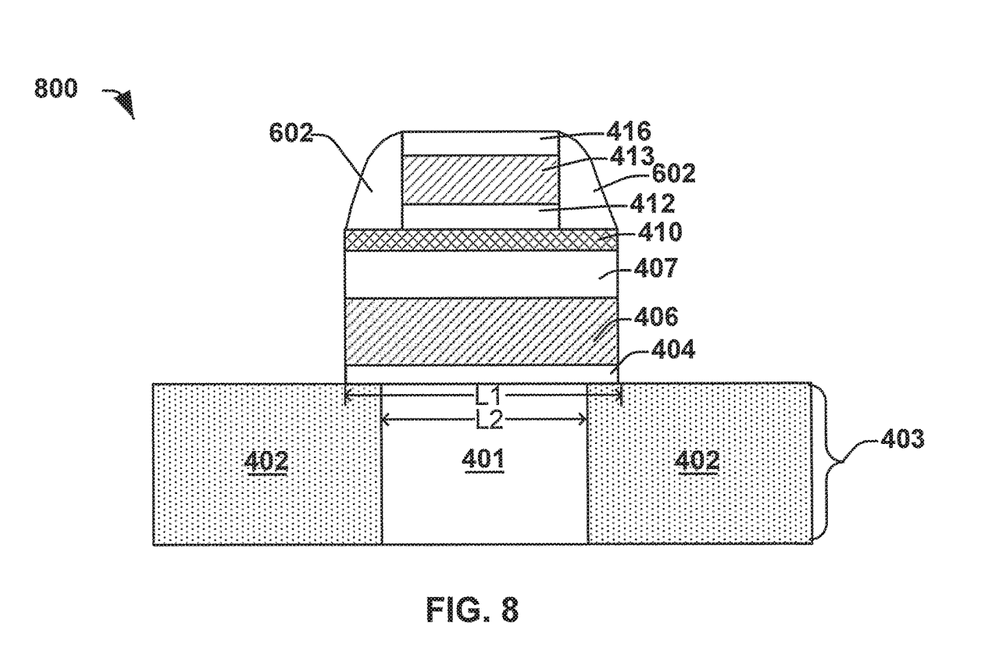

FIG. 8 illustrates a cross sectional image 800, after performing a third etch to remove exposed portions of the CESL 404, stopping at the metal interconnect structure 401. Outer sidewalls of the CESL 404 are substantially aligned to outer sidewalls of the bottom electrode. In some embodiments, the outer sidewalls of the CESL are separated by a first distance (L1), and the outer sidewalls of the first metal interconnect structure are separated by a second distance (L2), where the first distance is less than 1.2 times the second distance and greater than 0.8 times the second distance. i.e., $0.8*L2<L1<1.2*L2$.

Depending on the CESL material, the etchants used in the third etch vary. If the CESL comprises TiN, W, TiW or WN, a dry etch or wet etch using H2O2 is performed. If the CESL is Co/Ta, only a dry etch is performed and if the CESL is TaN, a wet etch with APM (ammonia peroxide mixture) is performed.

Figure 9:
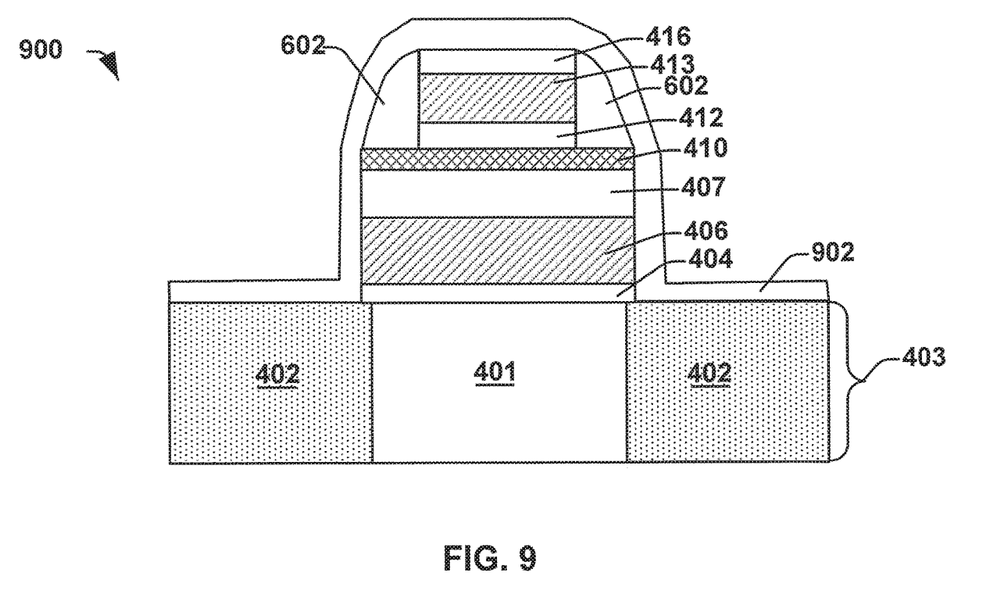

FIG. 9 illustrates a cross sectional image 900, where a dielectric protection layer 902 is formed enveloping the whole RRAM stack and the exposed portions of the semiconductor workpiece 403. In some embodiments, the dielectric protection layer comprises silicon carbide (SiC).

Figure 10:
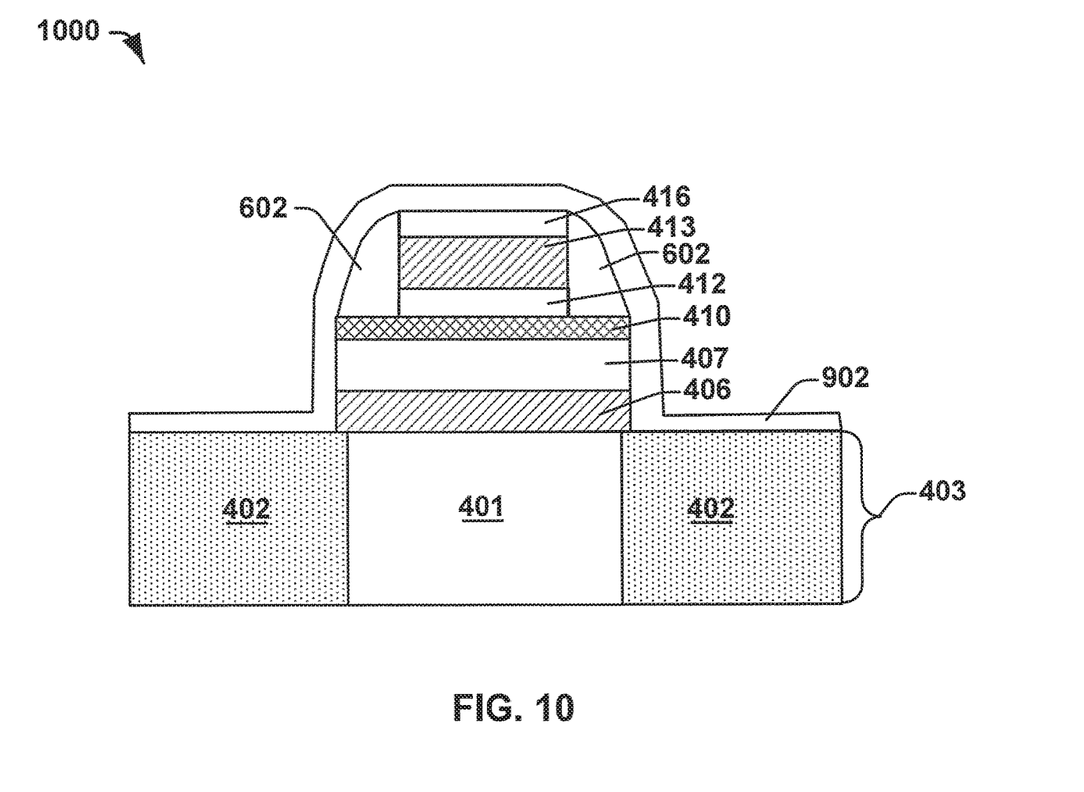
FIG. 10 illustrates an embodiment of a cross sectional image of an RRAM stack, with a transitional nitride layer as the conductive etch-stop layer which resides between a conductive bottom electrode and a first metal interconnect.

FIG. 10 illustrates a cross sectional image 1000 of an embodiment of a semiconductor body, wherein the bottom electrode comprises a single conductive bottom electrode layer 407. In this embodiment, the CESL is the transitional nitride layer 406 which has an etch-selectivity different from that of the bottom electrode 407 and the metal interconnect structure 401 underneath.

Figure 11:
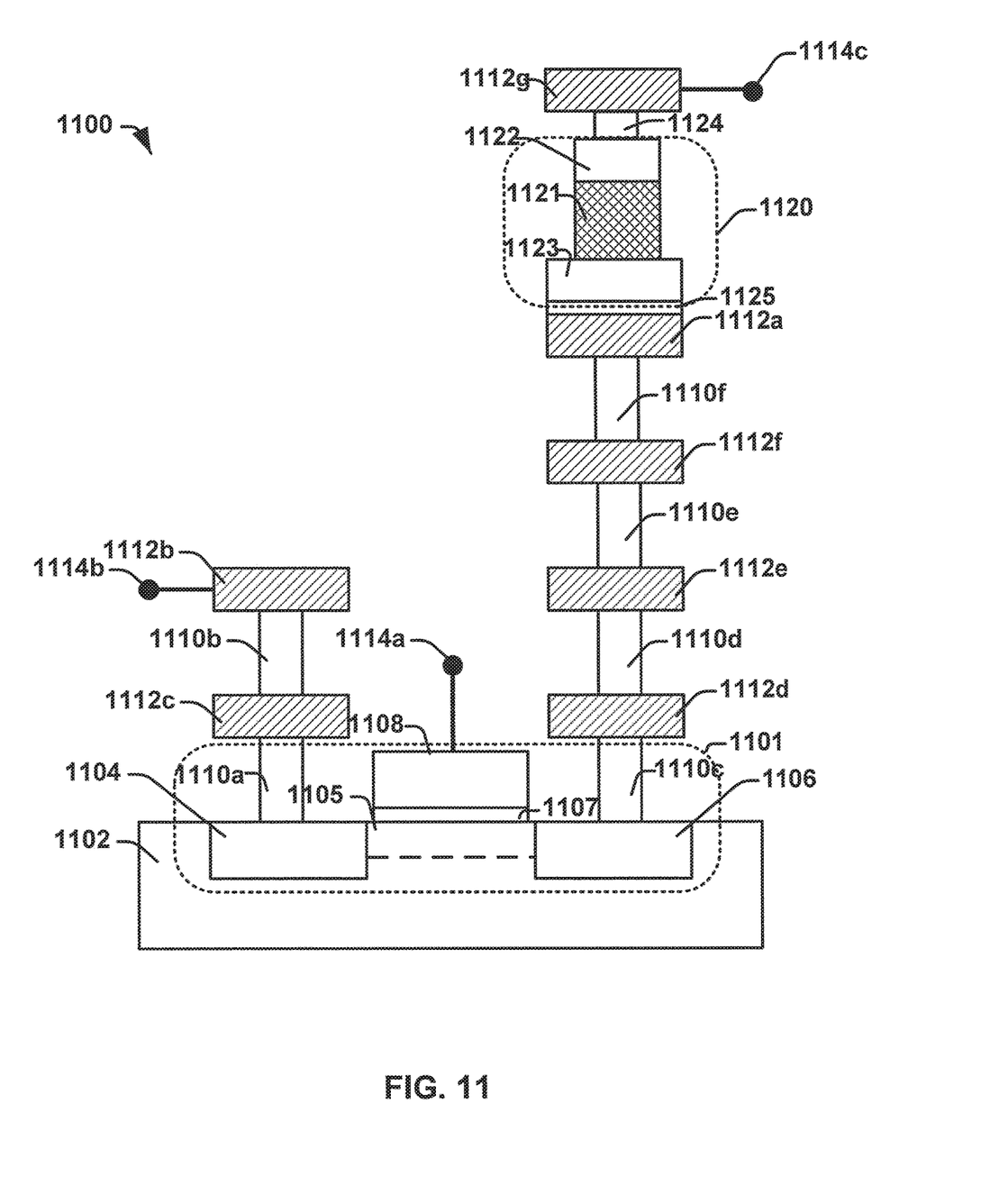
FIG. 11 illustrates a cross sectional view of some embodiments of an RRAM device with a conductive etch stop layer between the bottom metal interconnect and the bottom electrode of an RRAM stack.

FIG. 11 illustrates a cross sectional view of some embodiments of an RRAM device 1100 with a CESL according to the present disclosure. A plurality of such RRAM devices form a memory array configured to store data. FIG. 11 comprises a conventional planar MOSFET selection transistor 1101 to suppress sneak-path leakage (i.e., prevent current intended for a particular memory cell from passing through an adjacent memory cell) while providing enough driving current for memory cell operation. The selection transistor 1101 comprises a source 1104 and a drain 1106 comprised within a semiconductor body 1102, separated horizontally by a channel region 1105. A gate electrode 1108 is located on the semiconductor body 1102 at a position that is above the channel region 1105. In some embodiments, the gate electrode comprises poly silicon. The gate electrode 1108 is separated from the source 1104 and drain 1106 by a gate oxide layer or gate dielectric layer 1107 extending laterally over the surface of the semiconductor body 1102. The drain 1106 is connected to a data storage element or RRAM stack 1120 by way of a first metal interconnect 1112a. The source 1104 is connected by way of a first metal contact 1112b. The gate electrode is connected to a word line 1114a, the source is connected to a select line 1114b through the first metal contact 1112b and the RRAM stack 1120 is further connected to a bit line 1114c comprised within an upper metallization layer by way of a second metal contact 1112g. A desired RRAM device may be selectively accessed using word lines and bit lines for reading, writing and erasing operations. One or more metal contacts comprising 1112c, 1112d, 1112e, 1112f and metal contact vias comprising 1110a, 1110b, 1110c, 1110d, 1110e, 1110f etc. that helps in connecting the RRAM memory device with the external circuitry may be present between the drain 1106 and the second metal contact 1112g, and between the source 1104 and the first metal contact 1112b. In some embodiments, the metal contacts comprise copper (Cu).

The RRAM cell 1120 comprises a resistive switching element/variable resistive dielectric layer 1121 sandwiched between a top electrode 1122 and a bottom electrode 1123. In some embodiments, the top electrode comprises titanium (Ti) and tantalum nitride (TaN), the bottom electrode comprises titanium nitride (TiN) alone or two layers comprising TiN and TaN, and the resistive switching element comprises hafnium dioxide (HfO2). A top electrode via (TEVA) 1124 connects the top electrode 1122 of the memory cell 1120 to the second metal contact 1112g and a CESL 1125 connects the bottom electrode 1123 of the RRAM cell 1120 to the first metal interconnect 1112a.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a resistive random access memory (RRAM) device comprising a resistive random-access memory (RRAM) stack having a conductive etch-stop layer (CESL) that couples a bottom electrode to a first metal interconnect structure arranged under the bottom electrode. The CESL has an etch-selectivity different from that of the bottom electrode and the first metal interconnect structure which allows a dry or dry+ wet etch to be performed on the CESL, landing on the metal interconnect structure. The disclosure presents a simple structure and process that saves one mask step and that requires no CMP process during the formation of the bottom electrode, compared to traditional processing methods.

In some embodiments, the present disclosure relates to a resistive random access memory (RRAM) device, comprising, a semiconductor substrate and a metal interconnect structure disposed within a low-k dielectric layer and disposed over the semiconductor substrate. The RRAM device further comprises a conductive etch-stop layer (CESL) abutting an upper surface of the metal interconnect structure and a bottom electrode structure over the CESL. The RRAM device further comprises a variable resistance dielectric structure over the bottom electrode structure and a top electrode structure over the variable resistance dielectric structure. The RRAM device further comprises sidewall spacers about outer sidewalls of the top electrode structure. Outer sidewalls of the bottom electrode structure are spaced apart by a first distance, and outer sidewalls of the top electrode structure are spaced apart by a second distance which is less than the first distance. The CESL is a transitional metal nitride layer having an etch-selectivity that differs from an etch-selectivity of the bottom electrode structure In another embodiment, the present disclosure relates to a resistive random access memory (RRAM) device, comprising, a metal interconnect structure disposed within a low-k dielectric layer and a conductive etch-stop layer (CESL) abutting an upper surface of the metal interconnect structure. The RRAM device further comprises a bottom electrode structure over the CESL, a variable resistive dielectric structure over the bottom electrode structure, and a top electrode structure over the variable resistive dielectric structure. Outer sidewalls of the metal interconnect structure are spaced apart by a first distance. Outer sidewalls of the bottom electrode structure are spaced apart by a second distance and outer sidewalls of the variable resistive dielectric structure are spaced apart by the second distance, the second distance being greater than the first distance. The CESL is a transitional metal nitride layer having an etch-selectivity that differs from an etch-selectivity of the bottom electrode structure. The bottom electrode structure is a single conductive electrode layer.

In yet another embodiment, the present disclosure relates to a resistive random access memory (RRAM) device, comprising, a semiconductor body having a source region and a drain region horizontally separated by a channel region and a gate structure disposed over the channel region. The RRAM device further comprises a metal interconnect structure disposed over the gate structure and a resistive random-access memory (RRAM) stack disposed above the metal interconnect structure. The RRAM stack comprises a conductive etch-stop layer (CESL) disposed on the metal interconnect structure and a bottom electrode structure disposed over the CESL. The RRAM stack further comprises a variable resistance dielectric structure disposed over the bottom electrode structure and a top electrode structure disposed over the variable resistance dielectric structure. The CESL abuts a top metal layer of the metal interconnect structure and a bottom surface of the bottom electrode structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) device comprising:
   a semiconductor substrate;
   a metal interconnect structure disposed within a low-k dielectric layer and disposed over the semiconductor substrate;
   a conductive etch-stop layer (CESL) abutting an upper surface of the metal interconnect structure;
   a bottom electrode structure over the CESL;
   a variable resistance dielectric structure over the bottom electrode structure;
   a top electrode structure over the variable resistance dielectric structure;
   sidewall spacers about outer sidewalls of the top electrode structure; and
   wherein outer sidewalls of the bottom electrode structure are spaced apart by a first distance, and outer sidewalls of the top electrode structure are spaced apart by a second distance which is less than the first distance;
   wherein the CESL has a first lateral width equal to a second lateral width of the metal interconnect structure; and
   wherein the CESL is a transitional metal nitride layer.

2. The RRAM device of claim 1, wherein the bottom electrode structure is a single conductive electrode layer.

3. The RRAM device of claim 1, wherein the CESL abuts a bottom surface of the bottom electrode structure.

4. The RRAM device of claim 1, wherein the variable resistance dielectric structure abuts a top surface of the bottom electrode structure.

5. The RRAM device of claim 1, wherein outer sidewalls of the variable resistance dielectric structure are spaced apart by the first distance.

6. The RRAM device of claim 1, wherein outer sidewalls of the metal interconnect structure are spaced apart by a third distance that is less than the first distance.

7. The RRAM device of claim 1, wherein outer sidewalls of the CESL are substantially aligned to outer sidewalls of the metal interconnect structure.

8. The RRAM device of claim 1, where the first distance is less than 1.2 times the second distance and greater than 0.8 times the second distance.

9. The RRAM device of claim 1, wherein a thickness of the CESL ranges from 10 Angstroms to 500 Angstroms.

10. The RRAM device of claim 1, wherein the CESL comprises titanium (Ti); titanium nitride (TiN); titanium tungsten metal (TiW); tungsten (W); tungsten nitride (WN); a combination of titanium, cobalt, or tantalum (Ti/Co/Ta); or tantalum nitride (TaN).

11. A resistive random-access memory (RRAM) device comprising:
   a metal interconnect structure disposed within a low-k dielectric layer, wherein outer sidewalls of the metal interconnect structure are spaced apart by a first distance;
   a conductive etch-stop layer (CESL) abutting an upper surface of the metal interconnect structure, wherein outer sidewalls of the CESL are spaced apart by a distance equal to the first distance;
   a bottom electrode structure over the CESL;
   a variable resistance dielectric structure over the bottom electrode structure; and
   a top electrode structure over the variable resistance dielectric structure; and
   wherein outer sidewalls of the bottom electrode structure are spaced apart by a second distance and outer sidewalls of the variable resistance dielectric structure are spaced apart by the second distance, the second distance being greater than the first distance;
   wherein the CESL is a transitional metal nitride layer; and
   wherein the bottom electrode structure is a single conductive electrode layer.

12. The RRAM device of claim 11, wherein the bottom electrode structure abuts a top surface of the CESL; and
   wherein the variable resistance dielectric structure abuts a top surface of the bottom electrode structure.

13. The RRAM device of claim 11, further comprising sidewall spacers about outer sidewalls of the top electrode structure.

14. The RRAM device of claim 11, wherein outer sidewalls of the top electrode structure are spaced apart by a third distance less than the second distance.

15. A resistive random access memory (RRAM) device, comprising:
   a semiconductor body having a source region and a drain region horizontally separated by a channel region;
   a gate structure disposed over the channel region between the source region and the drain region;
   a metal interconnect structure disposed over the gate structure;
   a resistive random-access memory (RRAM) stack disposed above the metal interconnect structure, wherein the RRAM stack comprises:
      a conductive etch-stop layer (CESL) disposed on the metal interconnect structure;
      a bottom electrode structure disposed over the CESL;

a variable resistance dielectric structure disposed over the bottom electrode structure; and a top electrode structure disposed over the variable resistance dielectric structure;

wherein the CESL abuts a top metal layer of the metal interconnect structure and a bottom surface of the bottom electrode structure; and wherein the CESL has a first lateral width equal to a second lateral width of the metal interconnect structure.

16. The RRAM device of claim 15, wherein outer sidewalls of the bottom electrode structure are spaced apart by a first distance, and outer sidewalls of the top electrode structure are spaced apart by a second distance which is less than the first distance.

17. The RRAM device of claim 15, wherein outer sidewalls of the CESL are substantially aligned to outer sidewalls of the metal interconnect structure.

18. The RRAM device of claim 15, wherein the CESL is made of tantalum nitride or titanium nitride.

19. The RRAM device of claim 15, wherein the bottom electrode structure is made of tantalum nitride.

20. The RRAM device of claim 15, wherein the source region is coupled to a source line, the drain region is coupled to a bit line and the gate structure is coupled to a word line of a memory array.

* * * * *